United States Patent [19]

Betz et al.

[11] Patent Number: 5,304,922
[45] Date of Patent: Apr. 19, 1994

[54] ELECTRICAL CIRCUIT WITH RESILIENT GASKET SUPPORT FOR RAISED CONNECTION FEATURES

[75] Inventors: Robert K. Betz, Long Beach; Blake F. Woith, Orange, both of Calif.

[73] Assignee: Hughes Aircraft Company, Los Angeles, Calif.

[21] Appl. No.: 904,740

[22] Filed: Jun. 26, 1992

Related U.S. Application Data

[62] Division of Ser. No. 749,770, Aug. 26, 1991, abandoned.

[51] Int. Cl.⁵ .............................. G01R 1/073
[52] U.S. Cl. .......................... 324/158 P; 324/158 F
[58] Field of Search ................ 324/158 P, 158 F, 72.5

[56] References Cited

U.S. PATENT DOCUMENTS

| | | |
|---|---|---|
| 4,116,517 | 9/1978 | Selvin et al. |
| 4,645,280 | 2/1987 | Gordon et al. |
| 4,899,099 | 2/1990 | Mendenhall et al. ............ 324/158 P |
| 5,059,898 | 10/1991 | Barsotti et al. .................. 324/158 P |
| 5,148,103 | 9/1992 | Pasiecznik, Jr. ................. 324/158 F |

FOREIGN PATENT DOCUMENTS

| | | |
|---|---|---|
| 0226995 | 12/1986 | European Pat. Off. |
| 0304868 | 8/1988 | European Pat. Off. |
| 0484141 | 10/1991 | European Pat. Off. |
| 2218580 | 5/1989 | United Kingdom |

Primary Examiner—Ernest F. Karlsen
Attorney, Agent, or Firm—Elizabeth E. Leitereg; Terje Gudmestad; W. K. Denson-Low

[57] ABSTRACT

A multi-layered flexible circuit comprises a plurality of electrical traces (52) formed on a rigid substrate (50) and each including a contact pad (56) from which is raised a projecting contact feature (58). The contact pads (56) and features (58) extend along a line or lines of such contact pads and connection features, and both the contact pads and the raised features carried thereby are supported at or above the plane of the circuit traces by a compressed molded elastomeric gasket (44) positioned adjacent and edge (66) of the rigid substrate that underlies the traces. The gasket directly underlies the line of contact pads and raised features and is incorporated during the lamination of the several layers.

9 Claims, 3 Drawing Sheets

ELECTRICAL CIRCUIT WITH RESILIENT GASKET SUPPORT FOR RAISED CONNECTION FEATURES

This is a division of application Ser. No. 749,770, filed Aug. 26, 1991, now abandoned.

BACKGROUND OF THE INVENTION

1. Field of the Invention

The present invention relates to interconnection of electrical circuits, and more particularly concerns an improved method for positioning and resiliently supporting a raised contact.

2. Description of Related Art

The ubiquitous printed circuits are being developed in ever expanding applications and continuously varying configurations. Both flexible and rigid printed circuits are connected to similar circuits and other components by means of various types of connecting devices. Test probes often have a configuration including a plurality of contacts around the perimeter of a test membrane, which contacts must electrically contact a test probe card that is mounted in a test fixture. Flat, flexible printed circuit connecting cables employ similarly configured connecting devices and have been developed to a point where connection between one such printed circuit cable and another circuit is made by providing a plurality of projecting metallic interconnection features that may be pressed against either similar features or mating metallic connecting pads on the other circuit component or components. Flexible circuit terminations or connecting wafers of this type are described in U.S. Pat. No. 4,125,310 to Patrick A. Reardon, II, deceased et al, U.S. Pat. No. 4,116,517 to Gerald J. Selvin, et al, and U.S. Pat. No. 4,453,795 to Norbert L. Moulin, et al. The connectors of these patents embody a substrate having traces chemically milled thereon with a plurality of metallic raised features later formed to project from the plane of the circuit conductors. Thus, when two such connectors are placed face to face, with the raised features in registration and contact with the other, the planes of the etched electrical circuits are suitably spaced from one another because of the projection of the features. The two circuits may be physically clamped together to press the features against one another, thereby making firm and intimate electrical contact between the two circuits.

Arrangements for manufacturing circuits with such raised contacts by electrodepositing techniques without any chemical milling are described in a co-pending application for Three-Dimensional Electroformed Circuitry of William R. Crumly, Christopher M. Schreiber and Haim Feigenbaum, filed Sep. 11, 1990, Ser. No. 07/580,758, now U.S. Pat. No. 5,197,184, which is assigned to the assignee of the present application. The disclosure of this co-pending application is incorporated herein by this reference as though fully set forth.

In the use of circuits connected by such raised contact features (sometimes called "gold dot connectors" for the gold coating of the raised features), a group of raised metallic buttons are pressed against contact pads or similar features on a facing circuit, and by virtue of their height above the plane of the circuit, separate the two facing circuits from one another. For optimum contact of all raised features of the group, all of the contacts or pads on both of the circuits must be planar, so that pressing the two circuits together will effectively cause equal contact pressure at each contact point. Because of the difficulty of maintaining precise planarity of such contact features, it has been suggested to employ contacts that are deformable, as in the Reardon U.S. Pat. No. 4,125,310, or to employ a continuous layer of resilient material, as in the U.S. Pat. No. 4,116,517 to Selvin, et al. Such arrangements are relatively complex and difficult to fabricate, and may not adequately account for actual departures from planarity of one or more of the contacts of a group. Moreover, in such arrangements the two circuits are exceedingly close to one another, being clamped together and held apart only by the height of the raised features which contact one another and effectively define the magnitude of the space between the facing circuit boards. If one or more of these raised features do not have sufficient height, it is possible that the circuit boards may contact one another. In an arrangement such as shown in the Selvin patent, where a complete sheet of elastomer is employed, the elastomer has projections precisely positioned to enter the hollow rear portion of each raised feature, and thus is exceedingly difficult to fabricate and to position during lamination of the several layers. A further problem of arrangements of the prior art is that they do not readily lend themselves to effective use in test probe circuits.

Accordingly, it is an object of the present invention to provide raised feature interconnections that avoid or minimize above mentioned problems.

SUMMARY OF THE INVENTION

In carrying out principles of the present invention in accordance with a preferred embodiment thereof a composite multi-layer circuit board is formed by lamination of a rigid substrate layer and a circuit trace layer which has connector pads and raised features projecting from the pads. A molded elastomeric gasket is positioned in the rigid substrate layer beneath the connector pads and projections and compressed during lamination of the composite multi-layer board, whereby the gasket resiliently supports the connector pads and projections at or above the plane of rigid portions of the board.

DESCRIPTION OF THE PREFERRED EMBODIMENT

The present invention is applicable to many different types of circuit boards and electrical interconnections between them, including flexible, rigid or combined rigid and flexible circuit boards, flexible cable connections and test probe equipment. For purposes of exposition, the invention will be described as used in a circuit wafer test probe. Description of this test probe will readily suggest the nature and application of the invention to the connections of other types of circuits.

Figure 1:
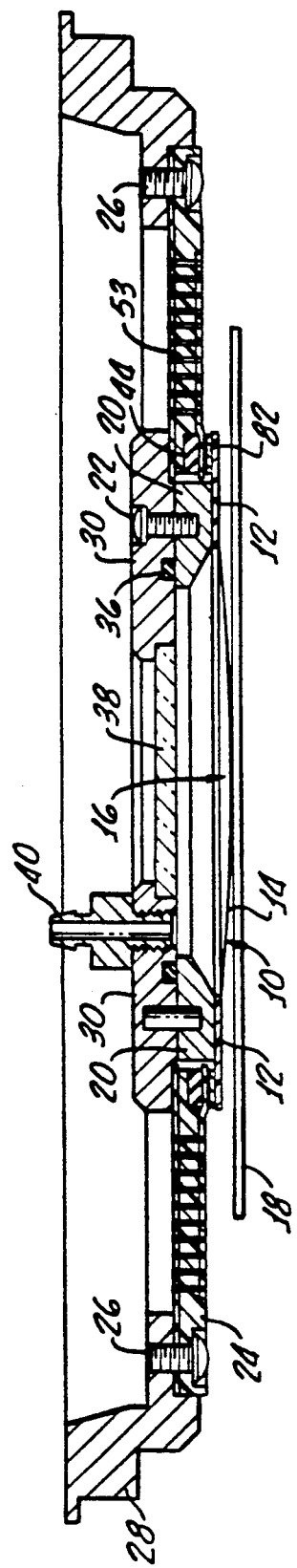
FIG. 1 is a simplified cross sectional view of a test probe membrane and probe card embodying features of the present invention.
Figure 2:
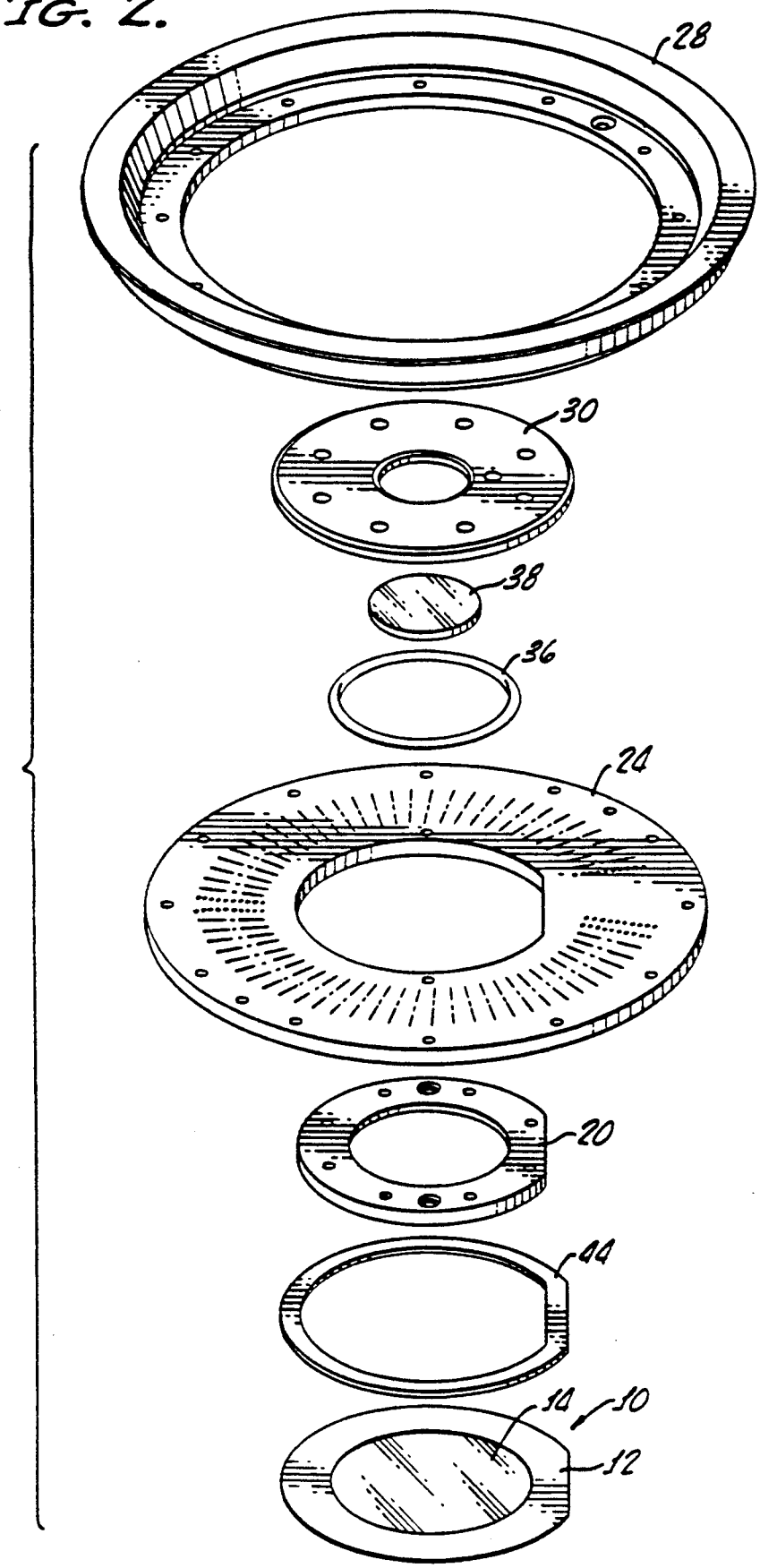
FIG. 2 is an exploded view of elements of the probe membrane and probe card of FIG. 1.

Illustrated in a simplified cross section in FIG. 1, and in exploded view in FIG. 2, is a generally circular test probe 10 including a rigid membrane annulus 12 that supports a thin, flexible, transparent membrane 14. Membrane 14 carries on its lower surface (as viewed in the drawing of FIG. 1) a number of circuit traces 80 (FIG. 3) which terminate in contact pads (not shown in FIG. 1) in a central area 16 of the membrane. The circuit traces extend along the undersurface of the membrane to the undersurface of the rigid membrane annulus 12 and extend through the annulus to contact pads 82 (FIG. 3) on the upper surface of the rigid annulus 12. A wafer 18 (FIG. 1), which is to be tested, may contain on its upper surface a plurality of integrated circuit chips each having test contact pads which are formed in a pattern that matches the contact pads on the undersurface of the membrane central area 16. The test probe 10 fixedly carries a membrane clamp ring 20 secured to an inner portion of the upper surface of the rigid membrane annulus and having a number of circumferentially spaced threaded apertures for reception of securing bolts, such as bolts 22.

A generally annular probe card 24 is secured, as by bolts 26, to a test fixture frame 28 (FIGS. 1 and 2). Along the inner periphery of the probe card 28 is positioned a probe card clamp ring 30 through which bolts 22 extend to securely and detachably clamp the inner edge of the annular probe card 24 between the membrane annulus 12 and the probe card clamp ring 30. Probe card clamp ring 30 is sealed to membrane clamp ring 20 by means of an o-ring 36 and carries at its inner periphery a glass window 38 through which the transparent membrane 14 and its test contacts can be viewed to facilitate registration with contact pads on the circuit chip to be tested. An air fitting 40 is mounted to the probe card clamp ring 30 to introduce air under pressure to the sealed chamber formed between the glass window 38 and the membrane 14, and thereby urge the flexible transparent membrane 14 against the test pads of a circuit being tested to ensure proper contact therebetween.

Electrical circuit traces 52 (FIG. 3) extend along the lower surface of the probe card 24 to an inner end where they are provided with contact pads 56 and raised contact features 58 which contact connector pads 82 on the membrane rigid annulus 12. Circuit traces on the lower side of the probe card 24 are connected through vias 53 extending through the circuit board for connection to other test fixture circuits (not shown).

In accordance with principles of the present invention, an elastomeric gasket 44 is formed as part of the multi-layer probe card 24 and underlies or extends along the row of raised contacts on the underside of the probe card. The terms "underlie", "overlie", "above" and "below" are employed to describe relative positions but not absolute directions, as the described circuits and boards can be used in any position with either of two connected parts above the other or with the parts side by side, extending horizontally or in some other orientations.

Figure 3:
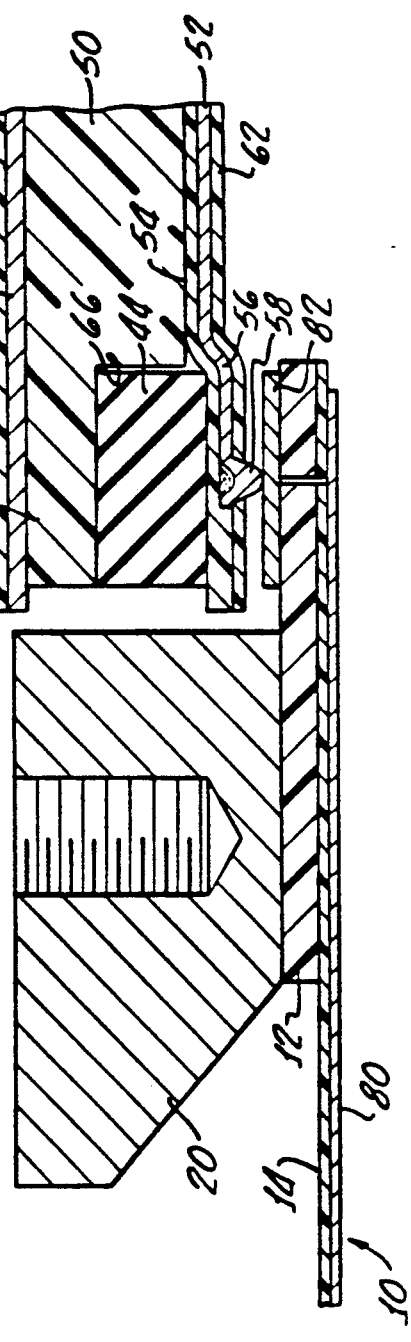
FIG. 3 is an enlarged fragmentary cross section showing an electrical contact between the probe card and the membrane.

FIG. 3 illustrates details of the construction of the probe card and the manner in which its raised features connect to contact pads on the membrane. The probe card is a substantially rigid multi-layer circuit board including a rigid dielectric annular intermediate layer 50. The intermediate layer 50 includes the annular gasket 44 at the inner peripheral edge of the card. The layer of circuit traces 52 is formed on the intermediate layer 50 and secured thereto by a thin flexible layer of dielectric and adhesive, such as Kapton and acrylic, identified collectively by reference numeral 54. Circuit traces 52 have contact pad portions or connector areas 56 integrally formed near their ends from which project the raised features or contact buttons 58. In one form the raised contact features 58 may be hollow and filled with a strengthening epoxy 60 that is cured to a solid form. The layer of circuit traces and connector areas 56 is covered with a dielectric coverlay or insulation 62 that allows free ends of the projecting features 58 to protrude. If deemed necessary or desirable, the free ends of projecting features 58 are flash coated with gold.

A near side (lower side as viewed in FIG. 3) of the gasket 44 is immediately adjacent and underlies the connector areas 56 and raised features 58. To support the remote or distal side of the elastomeric gasket 44, the intermediate rigid dielectric layer or some other rigid support must extend beyond the edge 66 of the rigid dielectric end portion and along the distal side of the gasket. In the arrangement illustrated in FIG. 3 the rigid dielectric 50 is formed with a rebated edge or groove to provide a rigid dielectric gasket support portion 70 extending along and supporting the distal side of the gasket 44. The gasket is seated in this groove and forms a continuation of the rigid dielectric 50, to support the contact pad portions 56 and projecting features 58. A copper ground layer 74 is formed on the distal side of the rigid dielectric layer 50 and covered by a coverlay or insulation layer 76.

The resilient gasket 44 has an uncompressed thickness greater than the thickness of the rigid dielectric 50, and is compressed during the lamination process, as will be described below. Upon release of compression of the lamination process the gasket tends to expand, and may expand to an extent depending upon the amount of restraint imposed by the Kapton/acrylic layer 54. Such expansion tends to urge the pad portions 56 of the circuit traces outwardly of the plane of the traces 52. Outward displacement of the pad portions ensures that the raised features protrude a sufficient distance outwardly of the circuit trace plane to form the desired contact and to provide the desired spacing between connected circuits. Moreover, because the base of the raised feature is itself raised (e.g. outwardly displaced), the projecting feature can be of a lesser height than might otherwise be required for a desired total height above the circuit traces.

FIG. 3 illustrates circuit traces 80 on the outermost surface of membrane 14 terminating in membrane contact pads 82 on the inner side of annulus 12. These pads 82 are held in pressed contact with the free ends of the raised features 58 of the probe card by clamping action of bolts 22 and clamp rings 20,30. In a test probe of the type described herein, the membrane contact pads and the raised features on the probe card extend in one or more concentric circumferential rows around the outer periphery of the membrane annulus and the inner periphery of the probe card. Only one such row is seen in FIG. 3 for purposes of clarity of the drawing. The patterns of contact pads and raised features may be of any selected configuration with at least part of the contact pad pattern matching a corresponding part of the raised feature pattern.

It will be seen from the illustration in FIG. 3 that the circuit traces 52 and pad portions 56 extend radially inwardly beyond the end 66 of the rigid dielectric 50 so that the gasket 44, which is positioned along the edge 66 of the dielectric, has a surface that extends along and supports the pad portions 56 and projections 58. The rigid dielectric in this arrangement includes the described cutaway extending lip 70 that forms a support element for the side of the elastomeric gasket that is remote from the projections 58.

Figure 4:
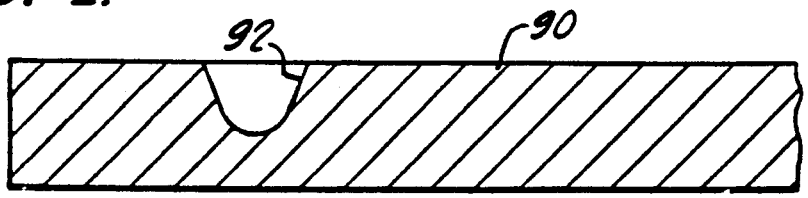
FIGS. 4, 5 and 6 illustrate certain steps in one exemplary form of manufacture of the probe card.
Figure 5:
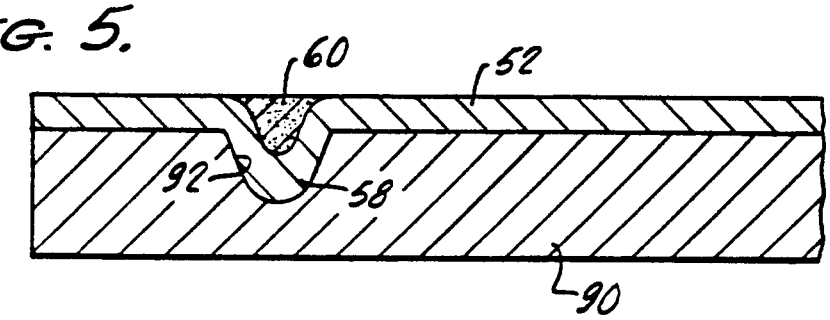
Figure 6:
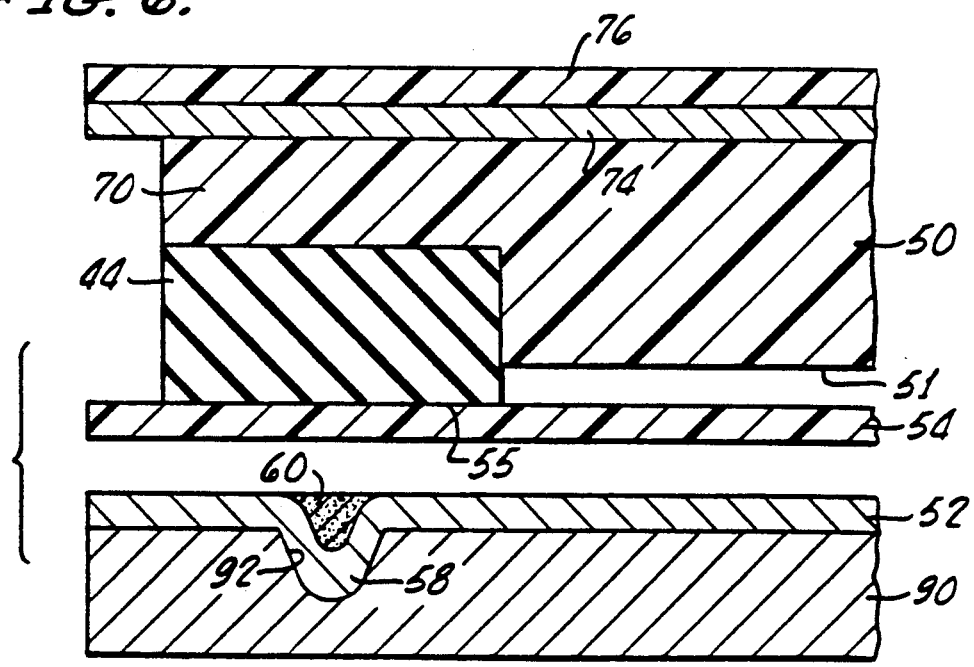

The probe card with its projecting contact pads and raised features may be formed in many different ways, as will be readily understood by those skilled in the art. The circuit traces and raised features may be formed by processes such as described in the U.S. Pat. Nos. 4,125,310 to Reardon II, et al and 4,453,795, to Moulin, wherein chemically milled circuits have raised features or buttons plated thereon. Another example of one manner of forming the probe card is illustrated in FIGS. 4, 5 and 6, which show certain steps in a method for additively forming the circuit traces and projecting features. The steps in this additive method are substantially similar to those described in the above-identified patent application of Crumly, Schreiber and Feigenbaum for Three-Dimensional Electroformed Circuitry.

A stainless steel mandrel 90 (FIG. 4) is formed with a depression 92 and then coated with a pattern of non-conductive material, such as Teflon (not shown). The patterned Teflon coating defines a pattern of exposed steel of the mandrel upon which circuit traces are to be additively formed. The mandrel is then electroplated to deposit a layer of conductive material, such as copper 52 (FIG. 5), over the areas of the mandrel surface not covered by the Teflon pattern. The copper plating enters the depression 92, forming a somewhat hollow projection feature 58, which is then filled with a solid, such as epoxy 60. A sub-assembly is formed of the rigid dielectric 50, having the elastomeric gasket 44 positioned at an end of the dielectric or in the groove formed in the dielectric end, as illustrated in FIG. 6. The elastomeric gasket in its uncompressed condition (as shown in FIG. 6) has a thickness approximately 5 mils greater than the exemplary 0.125 inch thickness of the dielectric 50 and is positioned to extend over the raised contact feature. A layer of a polyamide, such as Kapton, and a layer of acrylic adhesive (collectively indicated at 54), each of a thickness of 1 to 2 mils, is applied to the rigid dielectric 50. With the elastomeric gasket in place, the sub-assembly of rigid dielectric, gasket and Kapton/acrylic is pressed against the copper traces 52 on the mandrel with sufficient heat and pressure to compress the gasket so that its surface 55 is coplanar with the surface 51 of the rigid dielectric 50. The polyamide and adhesive are then cured. This lamination step secures the dielectric to the copper traces and pads, compressing the elastomeric gasket between the dielectric and the mandrel. Upon release of the pressure the elastomeric gasket may retain some compression and may have it surface 55 remain coplanar with the surface 51 of the rigid dielectric 50. In some arrangements the gasket expands slightly from its fully compressed position (where it is coplanar with the rigid dielectric), but this expansion is restrained to some extent by the thin, flexible Kapton/acrylic layer 54, which helps to prevent the gasket from returning to its fully unstressed or uncompressed condition. Nevertheless, the expansion of the elastomeric gasket after release of the compression of the described laminating step in some arrangements may be sufficient to displace portions of the circuit traces, including the pad portions and projecting features 58, beyond the plane of the traces 52 that are directly on the rigid dielectric. Such displacement is illustrated in FIG. 3.

Thereafter, the copper ground plane 74 and coverlay insulation 76 are applied to the probe card. The latter may be then separated from the mandrel 90, exposing the probe card surface carrying the circuit traces 52 and the projecting features 58. The traces 52 and pad portions 56 are then covered with an insulating cover layer 62 (FIG. 3) to complete this aspect of fabrication of the multi-layer probe card.

The completed probe card is then secured to the test fixture frame 28. A test membrane 10, having a suitable configuration of test contacts for testing the given integrated circuit chip on wafer 18, is then secured, as by screws 22, to the probe card and test fixture to cause the contact pads 82 to be pressed against the tips of projecting features 58. The contact pressure is resiliently resisted by slight compression of the elastomeric gasket 44, which thus accommodates differences in heights of individual ones of the line or lines of projecting features 58 and also accommodates lack of planarity of the contact surfaces of the membrane contact pads 82.

It will be seen that the two connected circuits, the membrane 10 and the probe card, lie in different planes and are separated by a distance determined at least in part by the height of the projecting feature 58 above its pad portion 56. In the embodiment shown in FIG. 3, this separation distance is increased by the additional displacement of both pad portions and raised contacts from the plane of the circuit traces 52. The preformed molded gasket 44 is incorporated into the multi-layer probe card during the lamination of the card, forms an integral part of the composite card and raises the projecting features by a significant amount above the plane of the rigid board.

Although the gasket arrangements for supporting raised features have been disclosed herein as used in test probe devices, it will be readily appreciated that the structures and methods described may be used in the fabrication of many other types of circuits, including rigid flex circuits which embody circuits formed on thin, flexible substrates coupled with circuits formed on rigid substrates.

What is claimed is:

1. A test probe comprising:
    a test membrane having a plurality of membrane traces,
    a membrane annulus supporting said membrane and having a plurality of contact pads connected with said membrane traces,
    a multi-layer circuit card for detachable connection to said test membrane, said circuit card comprising:
        a rigid dielectric layer of a first thickness having an annular rebated edge portion defining an annular cutaway lip that forms a gasket support element,
        a plurality of circuit card traces on said rigid dielectric layer having contact portions extending beyond said lip, said circuit card traces having contacts projecting from said contact portions,
        an annular elastomeric gasket positioned at and supported by said cutaway lip of said rigid dielectric layer, underlying said contact portions and projecting contacts, and being laminated to said dielectric layer and said circuit card traces, and
        a flexible dielectric layer secured to said rigid dielectric layer and to said gasket and extending over said gasket, said gasket having an unstressed thickness greater than said first thickness and being resiliently compressed between said flexible dielectric layer and cutaway lip, and means for pressing said circuit card against said membrane annulus so as to press said projecting contacts against said contact pads.

2. The probe of claim 1 wherein said traces lie in a common plane and wherein said contact portions are displaced by said gasket outwardly from said common plane.

3. The probe of claim 1 wherein said flexible dielectric layer underlies said rigid dielectric layer and said gasket, said gasket resiliently pressing said contact portions outwardly of said common plane.

4. The probe of claim 1 wherein contact pads of said membrane annulus are mutually spaced along a predetermined elongated contact path, wherein said projecting contacts are located along a card path that matches said contact path, and wherein said gasket comprises a strip of molded elastomer extending along said card path.

5. The probe of claim 1 wherein said multi-layer circuit card further comprises a layer of adhesive interposed between said elastomeric gasket and said circuit traces.

6. The probe of claim 5 wherein said multi-layer circuit card further comprises a layer of dielectric covering portions of said circuit traces.

7. The probe of claim 6 wherein said multi-layer circuit card further comprises a layer of conductor formed on the distal side of said rigid dielectric layer and a layer of insulation on said conductor layer.

8. The probe of claim 1 wherein said pads are mutually spaced along a path extending above said trace plane adjacent ends of said traces, and wherein said gasket comprises a narrow strip of molded elastomeric material extending along said line beneath said pads and raised contacts.

9. The probe of claim 8 wherein said gasket as compressed between said rigid dielectric layer and said flexible dielectric layer has a thickness greater than the thickness of said rigid dielectric layer.

* * * * *